United States Patent [19]

Seng et al.

[11] Patent Number: 5,013,347
[45] Date of Patent: May 7, 1991

[54] GLASS BONDING METHOD

[75] Inventors: Chew E. Seng; Wee T. Hork; Wong Y. Lee, all of Singapore, Singapore

[73] Assignee: Microelectronic Packaging Inc., Scottsdale, Ariz.

[21] Appl. No.: 373,285

[22] Filed: Jun. 29, 1989

[51] Int. Cl.$^5$ .............................................. C03C 27/04
[52] U.S. Cl. ...................................... 65/43; 65/59.21; 427/193; 427/204; 437/225
[58] Field of Search .................... 65/18.1, 43, 59.21, 65/59.5, 60.8; 437/225; 427/189, 193, 196, 204

[56] References Cited

U.S. PATENT DOCUMENTS

| | | | |
|---|---|---|---|
| 2,220,775 | 11/1940 | Navias | 65/18.1 X |
| 2,248,644 | 7/1941 | Reger et al. | 65/18.1 X |
| 3,188,400 | 6/1965 | Vilensky | 65/43 X |
| 3,189,978 | 6/1965 | Stetson | 65/43 X |
| 3,222,150 | 12/1965 | Shepard | 65/59.21 X |
| 3,308,525 | 3/1967 | Tsuji et al. | 65/18.1 X |
| 3,362,804 | 1/1968 | Hamilton | 65/48 X |
| 3,529,349 | 9/1970 | Schoot et al. | 65/43 X |
| 4,051,404 | 9/1977 | Kupsky | 65/43 X |

OTHER PUBLICATIONS

Nippon Electric Glass, 1-14 Miyahara, 4-Chome, Yodogawa-Ku, Osaka 532 Japan, Product Brochure, entitled Neg Technical Glass Fourth Edition, pp. 6 and 7.

*Primary Examiner*—Robert L. Lindsay
*Attorney, Agent, or Firm*—Victor Flores; Harry M. Weiss; Antonio R. Durando

[57] ABSTRACT

A structure for packaging semiconductor integrated circuits including a ceramic housing consisting of a base and cap having opposed mating surfaces for subsequent mating during a cap-to-base sealing operation that encapsulates an integrated circuit within the ceramic housing. Each of the base and cap mating surfaces having at least one thin sintered layer consisting of at least two sealing glass paste compositions sequentially printed onto each of the opposed mating surfaces before being sintered. The sealing glass paste compositions containing a mixture of glass powder and a liquid vehicle. A first of the compositions is characterized by having a glass-to-vehicle ratio range of 9:1 to 15:1 which is facilitated by having a liquid vehicle containing a mixture consisting of 93 wt % isotridecyl alcohol, 5 wt % diacetone acetate and 2 wt % acrylic resin and a glass powder selected from the group of LS0113, LS2001B, XS1175M, and T187 industry type glass powders. A second of the compositions being characterized by having a glass-to-vehicle ratio range of 8:1 to 12:1, which is facilitated by having a liquid vehicle containing a mixture consisting of 93 wt % isotridecyl alcohol, 0 to 5 wt % acrylic resin with diacetone acetate being the remainder and a glass powder selected from the group of LS0113, LS2001B, XS1175M, and T187 industry type glass powders.

2 Claims, 3 Drawing Sheets

GLASS BONDING METHOD

FIELD OF THE INVENTION

The present invention relates to the manufacture of ceramic structure used in the semiconductor industry to encapsulate integrated circuits. More particularly, the present invention relates to ceramic bases and caps having sealing glass paste compositions having glazed layers of the composition on surfaces thereof.

DESCRIPTION OF THE PRIOR ART

In the production of a high reliability semiconductor integrated circuit device, a fragile integrated circuit (IC) and leads are encapsulated between two durable ceramic halves known as the base and the cap. The leads extend outward from the device for connection to a printed circuit board. The IC is protected by the ceramic base and cap, which also provide a rigid foundation for the IC. In order to adequately protect the IC from the environment, the cap and base are hermetically sealed using a sealing agent that has been previously deposited on opposed surfaces of the ceramic cap and base. The sealing agent, termed low temperature sealing glass, is formed from a paste composition comprised of a glass powder and a liquid vehicle. The paste composition can vary according to the glass type used and the composition of the liquid vehicle. The liquid vehicle can vary according to the selection of the binders, solvents, wetting agents, and dispersants that are used to produce it. Further, the glass-to-vehicle ratio presents another variable in the paste composition formula. Yet another variable in producing an effective sealing agent from the paste composition is in the deposition process of the sealing glass paste composition onto the ceramic material, namely the printing. Still another variable is the paste composition's capability to form a coherent layer of bonded sealing glass during the sintering, or glazing process.

The prior art sealing glass paste compositions have several problems which result in poor glaze quality. They have a high binder content, which results in high shrinkage of the sealing glass paste upon drying, poor visual appearance and reliability of the sealing glass after glazing, and high organic compound and moisture content of sealing glass. This means that the resulting layer of sealing glass will inadequately cover the base and cap surfaces and will produce an unreliable and non-functional bond.

Because the prior art sealing glass paste compositions produce results that are inconsistent and unreliable, the process of applying them is overly dependant on human operators. The inconsistent sealing glass paste compositions require the operator to make a determination of how many coats of the paste will be required to build-up a glazed layer of a specified thickness. Bad operator judgment will easily lead to an inferior glazed layer. Even when properly applied, the prior art sealing glass pastes produce inconsistent results. The inconsistency in their drying characteristics causes unpredictable bubbles in the glazed layer, causes the glass powder to splatter, and causes the glaze layer to lift from the ceramic surface after being fired and sealed by the IC manufacturer. In summary, the known sealing glass paste compositions have resulted in end-use sealing problems that have drastically reduced the production yields, reliability and customer satisfaction.

Therefore, a need is believed to exist for a sealing glass paste composition for use in a deposition process on ceramic base and caps that produces high end-use yield, that produces a good visual appearance bond that is easy to inspect, that has a low organic and moisture content when glazed and sealed, that has a low binder content and little, if any, residual organic content. A need is also seen to exist for a sealing glass paste composition that exhibits the qualities of being applied in a maximized consistent thickness in order to reduce and optimize the number of coats required to obtain a specified glazed layer thickness on ceramic product, and that will minimize operator dependance of the paste application process.

SUMMARY OF THE INVENTION

It is therefore an object of this invention to provide an improved sealing glass paste composition and deposition method which significantly lowers the required amount of binder in the paste in order to reduce shrinkage, reduces organic contaminants, and improves visual appearance of the sealing glass on semiconductor ceramic product.

It is another object of this invention to provide a sealing glass paste composition and deposition method which eliminate the need for highly controlled drying of the paste in order to minimize bubbles, peeling and splatter.

It is yet another object of this invention to provide a sealing glass paste composition and deposition method that maximizes the thickness of the sealing glass paste composition coatings and consistency between coats by controlling the glass-to-vehicle ratio in the composition of the paste.

Yet another object of the present invention is to produce ceramic product having glazed layers of the improved sealing glass paste composition.

The present invention satisfies the foregoing objectives by providing ceramic product for the semiconductor industry having a glazed sealing glass layer that is produced from a sealing glass paste composition that utilizes an improved liquid vehicle system. The sealing glass paste composition is characteristically improved over the prior known sealing glass paste compositions by having a higher glass-to-vehicle ratio, a reduced percent of liquid vehicle in the mixture, a higher percent of glass solids contents in the composition, a lower percent of binder in the vehicle and a lower percent of binder in the composition. The sealing glass paste composition of the present invention does not require the use of drying equipment during the printing cycle and thus eliminates problems associated with drying, namely voids, bubbles, and other flaws caused by dryers.

The sealing glass paste composition of the present invention is a mixture of a glass powder and a liquid vehicle having a glass-to-vehicle ratio ranging from 8.00 to 15.00 and a binder content of not more than 5 wt %. The glass powder is typically lead borosilicate with appropriate fillers, such as lead titanate, willemite, zirconium silicate, beta-eucryptite, cordierite and tin oxide while the ingredient of the liquid vehicle are isotridecyl alcohol, diacetone acetate and an acrylic resin as a binder. By example, it was found that a glass powder, such as industry type LS0113, when mixed with a liquid vehicle having 93% isotridecyl alcohol, 5% diacetone acetate and 2% binder, the resulting sealing glass paste composition will have a 14.2 percent glass-to-vehicle ratio. In contrast, using the same glass powder, i.e. LS0113, with a prior art liquid vehicle, a resulting glass paste required using 91% ester alcohol and 9% binder. The sealing glass paste composition of the present invention has higher and more stable viscosities that result in less shrinkage during glazing and thus enable predictable coat thickness applications that can be used immediately after mixing to minimize the paste inventory. The consistency of the paste composition enables control of the resulting glazed layer thickness so that a manufacturer can produce and thus offer customers a more reliable ceramic product.

DESCRIPTION OF THE PREFERRED EMBODIMENT

In describing the preferred embodiment of the sealing glass paste composition and the resulting ceramic product of the present invention, tabulated results found to characterize inferior sealing glass paste compositions are firstly presented.

Figure 1:
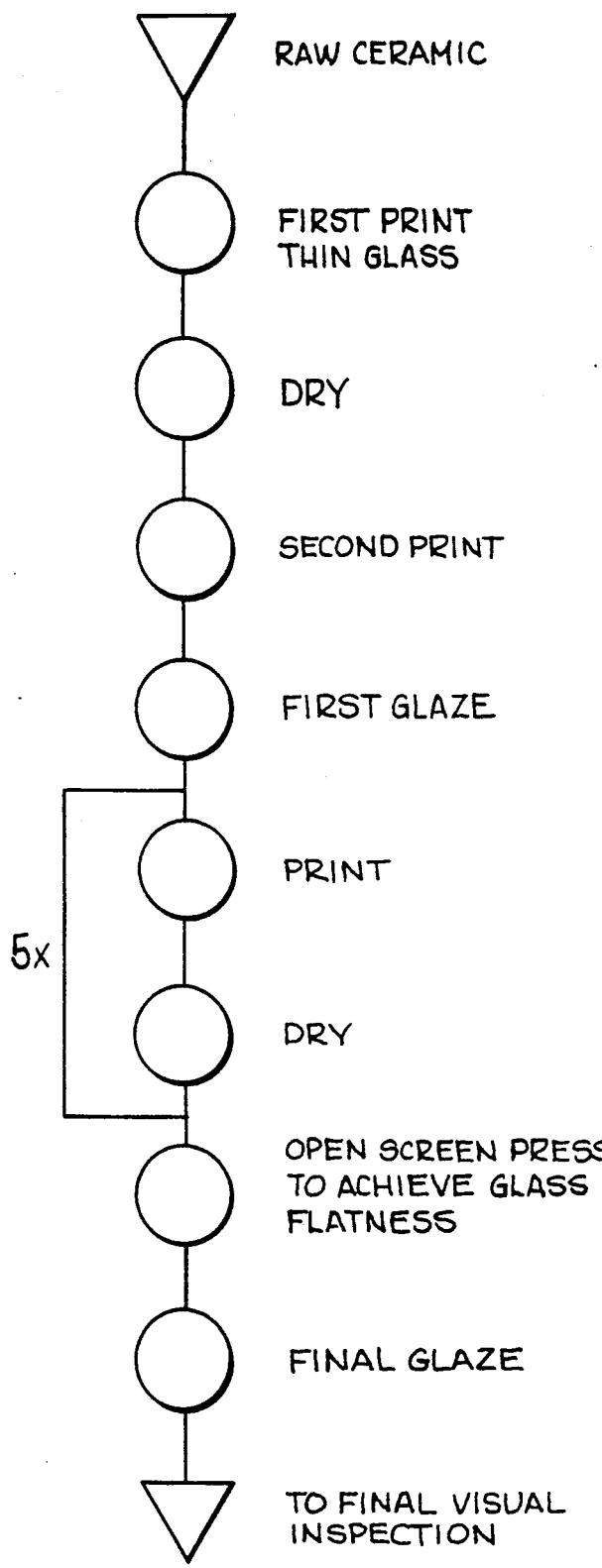
FIG. 1 is a flow process, designated FLOW 1, illustrating the steps required to sinter (glaze) prior art sealing glass paste compositions onto a ceramic base or cap.

Table I, shown below, summarizes typical prior art sealing glass compositions that are considered inferior and that exhibit the problems described below. The prior art printing and sintering process is depicted in FIG. 1 as the FLOW 1 process and includes the use of drying equipment and the multiple process loops required to produce glazed layers due to the low and unstable viscosities of the prior art sealing glass. The liquid vehicle used in producing the TABLE I data is shown in TABLE II and is referred to as the T-vehicle system and uses an ester alcohol, such as TEXANOL, that is commercially available from Eastman Chemical Products and an acrylic resin binder, commercially available from Dupont as Elvacite 2045. The possible recipes for the T-vehicle system are shown in TABLE II and include various percentages of the binder material mixed with TEXANOL used as a solvent.

As can be seen from examining TABLE I and TABLE II below, if glass LS0113 is used, the resulting paste has an 88.9 percent solid content and a 9.0 percent binder content in the vehicle and a 1% binder in the total composition. This sealing glass paste composition has a wide viscosity range, ranging from 45 to 60 kilocentipoise. The variable condition of the paste results in high setup adjustments of the printing machines, which means that the setup is highly dependent on the skill of the operator.

The pastes resulting from using the T-vehicle system must be rolled for 24 hours before use, which requires the manufacturer to have high quantities of paste inventory on hand and in various stages of preparation. Environmental fluctuations during this long preparation period will result in inconsistent paste.

Using the FLOW 1 process as shown in FIG. 1, the thickness of the deposited paste at each printing is unpredictable, due to the variable viscose condition of the paste, the variable setup of the printing machines, and the variable skill of the setup operators. This means that the number of coats required to obtain a given thickness cannot be precisely determined, but rather depends on the operator's judgment of when the given thickness has been achieved. Although the layers are of inconsistent thickness, they are consistently too thin. This means that many coats will be required in order to achieve a given thickness. Each additional printing carries with it additional risks of loss due to splatter, misalignment, voids, etc.

The prior art sealing glass pastes have been found to produce results in glazed glass densities that depart from a theoretical density, i.e. there are more voids in the sintered glass. Typical densities found with the T-vehicle system include: 5.58 +/−0.11 gm/cc of glass LS2001B having a theoretical density of 6.12 gm/cc, 5.90 +/−0.35 gm/cc of glass LS0113 having a theoretical density of 6.85 gm/cc, and 5.28 +/−0.09 gm/cc of glass T187 having a theoretical density of 5.60 gm/cc.

As the FLOW 1 process shown in FIG. 1 provides, the T-vehicle system requires the use of drying equipment in the printing process, which require daily profiling, resulting in higher manpower requirements. The use of dryers during the printing process cause problems associated with the wet/dry interface between the previous layer and the new coat of glass paste being applied. The use of dryers causes the binder to seep from the wet coat to the dry layer resulting in a greater binder content at the bottom than at the top, which means that the layer will have excessive organic voids during sintering.

The prior art sealing glass paste compositions exhibit poor quality due to performance involving shrinkage as related to surface area coverage (pullback) and thickness (including flatness). FLOW 1 T-vehicle systems using glass T187 have been shown to produce an average pullback of 4.4 +/−1.9 mils on a nominal glass pullback specification of 10 mils, and 23.8 +/−4.1 mils on a minimum critical seal area glass width and ceramic width differential specification of 30 mils. Similarly, FLOW 1 T-vehicle systems using glass T187 have been shown to produce glass thickness of 15.8 +/−0.4 mils on a nominal glass thickness specification of 18 mils +/−6 mils. Also, the glass flatness, measured as the range of thickness measurements taken at four points on the glass surface, is 2.6 +/−0.9 mils on a nominal glass flatness specification of 2.5 mils +/−6 mils. On a specification of 20 mils for recessed glass, the FLOW 1 T-vehicle composition has been shown to measure 10.3 mils, +/−2.9 mils.

With glass T187, FLOW 3E process produces an average pullback of 1.8 +/−2.2 mils at 10 mils pullback specification, and 17.1 +/−3.5 mils at 30 mils minimum critical seal area glass width and ceramic width differential specification. The glaze's flatness, measured as the range of thickness measurements taken at four points around the glaze, is 1.0 +/−0.5 mils. On a specification of 20 mil for recess glass, the FLOW 3E has been shown to measure approximately 7.8 +/−1.8 mils.

The problems with prior art sealing glass compositions result in an increased production costs. An average run of FLOW 1 with the T-vehicle system will produce a yield of only 89.2 percent, including major defects of 3.4 percent of the pieces lost to bubbles, 2.5 percent to back splatter, 1.9 percent to cavity splatter, and 1.6 percent to voids.

a. Ingredients
  i. D-Agent — Diacetone Acetate
  ii. E-solvent — Isotridecyl Alcohol
  iii. Resin (binder) — Acrylic Resin
b. Preparation of D-Solution
  i. D-Agent — 1500 gm
  ii. Resin (Binder) — 600 gm
  iii. TOTAL — 2100 gm
c. Preparation of E-Vehicle
  i. D-Solution — 140 gm
  ii. E-Solvent — 1860 gm
  iii. TOTAL — 2000 gm
d. Composition of E-Vehicle
  i. D-Agent — 100 gm
  ii. Resin (Binder) — 40 gm
  iii. E-Solvent — 1860 gm
  TOTAL — 2000 gm
e. Percent Binder In E-Vehicle
  40 gm Binder = 2% Binder
  2000 gm Total

TABLE I
PRIOR ART INFERIOR COMPOSITIONS OF SEALING GLASS PASTES

| Sealing Glass Type | Basic Composition Parts by Weight Glass | Basic Composition Parts by Weight Vehicle | Ratio of Glass to Vehicle | % Vehicle in Mixture | Solids Content % | % Binder in Vehicle | % Binder in Total Composition Wet Basis | % Binder in Total Composition Dry Basis |
|---|---|---|---|---|---|---|---|---|
| LS0113 | 8.0 | 1.0 | 8.0 | 11.11 | 88.89 | 9.0 | 1.00 | 1.11 |
| LS2001B | 7.55 | 1.0 | 7.55 | 11.70 | 88.30 | 9.0 | 1.05 | 1.18 |
| T 187 | 6.00 | 1.0 | 6.0 | 14.29 | 85.71 | 9.0 | 1.29 | 1.48 |

TABLE II
T-VEHICLE SYSTEM

| Ingredients | 5% | 9% | 10% | 12% |
|---|---|---|---|---|
| ester alcohol | 2850 gm | 2730 gm | 2700 gm | 2640 gm |
| resin (binder) | 150 gm | 270 gm | 300 gm | 360 gm |
| TOTAL | 3000 gm | 3000 gm | 3000 gm | 3000 gm |

The sealing glass plate composition of the present invention is a mixture of a glass powder and a liquid vehicle having a glass-to-vehicle ratio ranging from 8.00 to 15.00 and a binder content of not more than 5 wt. %. The glass powder is typically lead borosilicate with appropriate fillers, such as lead titanate, willemite, zirconium, silicate beta-eucryptite, cordierite silicate and tin oxide while the ingredient of the liquid vehicle are isotridecyl alcohol, diacetone acetate and an acrylic resin as a binder. The basic recipe for the liquid vehicle that produces the foregoing results includes:

The E-vehicle having the above composition when mixed with various commercially available glass powders produces data as tabulated in TABLE III A for thick glass (having a glass-to-vehicle ratio range ob 9.0 to 15) and Table III B for thin glass (having a glass-to-vehicle ratio range of 8.0 to 12.0).

TABLE III
IMPROVED SEALING GLASS PASTES COMPOSITIONS

| Sealing Glass Type | Basic Composition Parts by Weight Glass | Basic Composition Parts by Weight Vehicle | Ratio of Glass to Vehicle | % Vehicle in Mixture | Solids Content % | % Binder in Vehicle | % Binder in Total Composition Wet Basis | % Binder in Total Composition Dry Basis |
|---|---|---|---|---|---|---|---|---|
| A. Thick Glass (High Solids Content, HSC) Coating ||||||||||
| LS0113 | 14.2 | 1.0 | 14.2 | 6.58 | 93.42 | 2.0 | 0.13 | 0.14 |
| LS2001B | 13.6 | 1.0 | 13.6 | 6.85 | 93.15 | 2.0 | 0.14 | 0.15 |
| XS1175M-1 | 9.5 | 1.0 | 9.5 | 9.52 | 90.48 | 2.0 | 0.19 | 0.21 |
| T 187 | 10.2 | 1.0 | 10.2 | 8.93 | 91.07 | 2.0 | 0.18 | 0.20 |
| B. Thin (Normal Thickness) Coating ||||||||||
| LS0113 | 12.0 | 1.0 | 12.0 | 7.69 | 92.31 | 0.00 | 0.00 | 0.00 |
| LS2001B | 10.5 | 1.0 | 10.5 | 8.70 | 91.30 | 0.00 | 0.00 | 0.00 |
| XS1175M-1 | 8.0 | 1.0 | 8.0 | 11.11 | 88.89 | 0.00 | 0.00 | 0.00 |
| T 187 | 8.7 | 1.0 | 8.7 | 10.31 | 89.69 | 0.00 | 0.00 | 0.00 |

Figure 2:
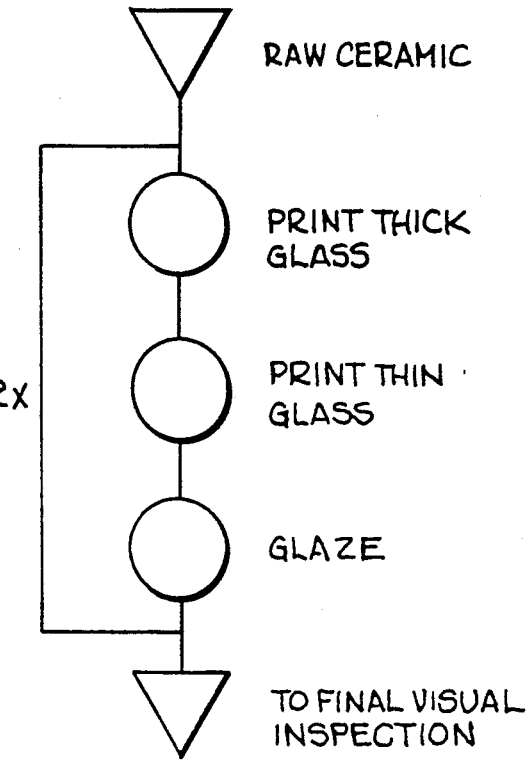
FIG. 2 is a flow process, designated FLOW 3E, illustrating the thick and thin printing steps made possible by the sealing glass paste composition of the present invention prior to sintering (glazing) the sealing glass paste compositions of the present invention onto a ceramic base or cap.

The sealing glass paste compositions which use the E-vehicle system can be compared with the TABLE 1 results where a T-vehicle is used. By example it was found that glass LS0113 when mixed with the E-vehicle, the resulting paste has a 93.4 percent solid content and a 0.14 percent binder content. The sealing glass paste composition using the E-vehicle has been found to have a more stable viscosity having a narrower and higher range, ranging from 94 to 104 kilo-centipoise. The higher and less viscous consistency of the sealing glass paste results in low setup adjustments of the printing machines, which means that the setup is relatively independent of the skill of the operator. More importantly, the sealing glass paste composition resulting from using the E-Vehicle has enabled the use of a flow process requiring fewer steps to produce glazed sealing glass layers on ceramic product. This flow process is shown in FIG. 2 and is referred to as the FLOW 3E process and shows the printing of thick glass paste then the thin glass paste to produce a more uniform and flatter layer of the sintered glass layer. It has been found that the thickness of the sintered layer produced at each printing is very predictable because of the less variable viscosity of the paste and that the printing machines require minimal adjustment between paste batches. This means that the number of coats required to obtain a given glaze thickness can be precisely determined, and remains independent of the operators' judgment. This also means that fewer coats will be required in order to achieve a given thickness, minimizing the likelihood of loss due to splatter, misalignment, voids, etc. Another benefit gained by the using the E-vehicle based sealing glass pastes is that the FLOW 3E process does not require the use of drying equipment and thus minimizes voids, bubbles, and other flaws caused by drying equipment. The present invention produces finished pieces with superior visual/ dimensional performance. With glass T187, a sealing glass paste has been produced having an average pullback of 1.8 +/−2.2 mils at 10 mils pullback specification, and 17.1 +/−3.5 mils at 30 mils critical seal area glass width and ceramic width differential specification. The glaze's flatness, measured as the range of thickness measurements taken at four points around the glaze, is 1.0 +/−0.5 mils. on a specification of 20 mils. for recess glass, the FLOW 3E has been shown to measure approximately 7.8 +/−1.8 mils.

An average run will produce a yield of 95.0 percent. Only 0.5 percent of the pieces will be lost to bubbles, 1.3 percent to back splatter, 0.5 percent to cavity splatter, 0.5 percent to voids, and 1.2 to other defects. It will produce glaze glass densities of: 6.10 +/−0.15 gm/cc using glass LS2001B having a theoretical density of 6.12 gm/cc, 6.40 +/−0.10 gm/cc using glass LS0113 having a theoretical density of 6.85 gm/cc, 5.38 +/−0.14 gm/cc using glass T187 having a theoretical density of 5.6 gm/cc, and 4.57 +/−0.12 gm/cc using glass XS1175 having a theoretical density of 4.75 gm/cc.

Figure 3:
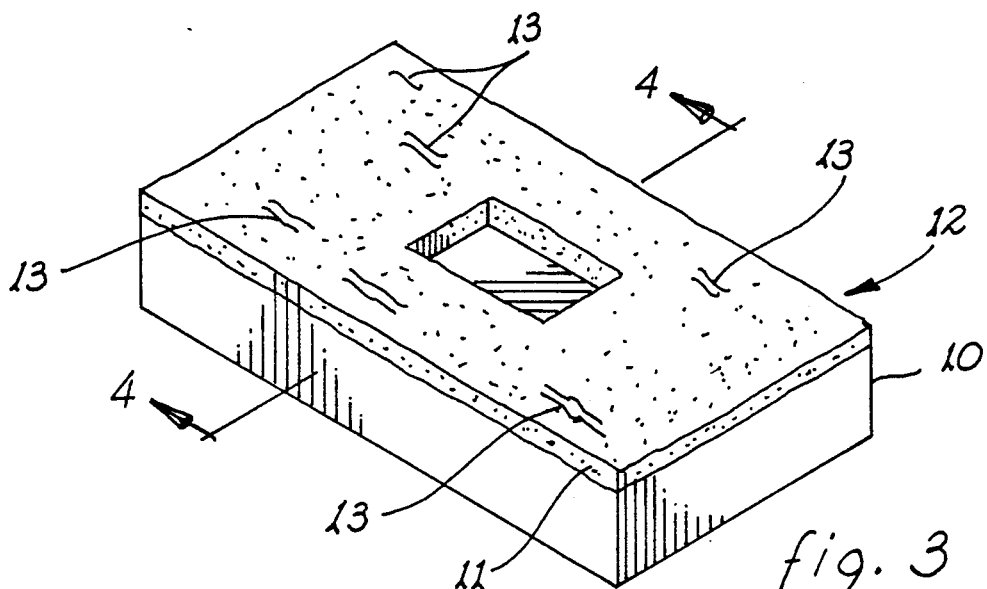
FIG. 3 is a perspective view of a ceramic base having a glazed layer of sealing glass formed onto its surface illustrating irregularities caused by inferior sealing glass compositions processed by the FLOW 1 flow process.
Figure 4:
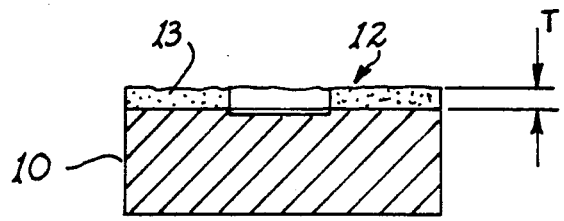
FIG. 4 is a cross-sectional view taken along the line 4—4 of FIG. 3 illustrating irregular surfaces on the glazed sealing glass.
Figure 4A:
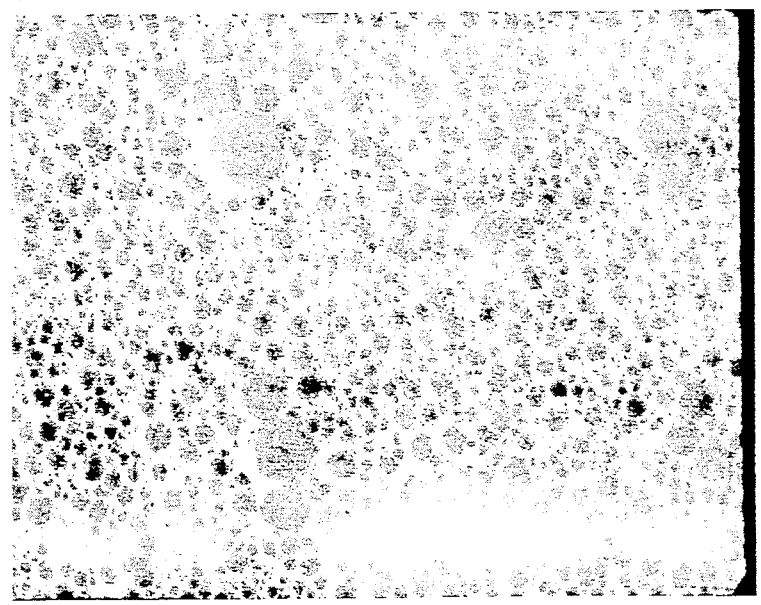
FIG. 4A is a magnified view (30x) of the cross section of the glazed layer produced by FLOW 1 after organic removal by heating.

FIG. 3 illustrates a ceramic base product 10 having a glazed layer 11 produced by the FLOW 1 process using an inferior sealing glass paste FLOW 1 SG where irregularities 13 are seen on surface 12. FIG. 4 is a cross section further illustrating glazed layer 11 having thickness T and irregularities 13 on surface 12. FIG. 4A is a magnified view (30x) of the cross section of the glazed layer produced by FLOW 1 after organic removal by heating.

Figure 5:
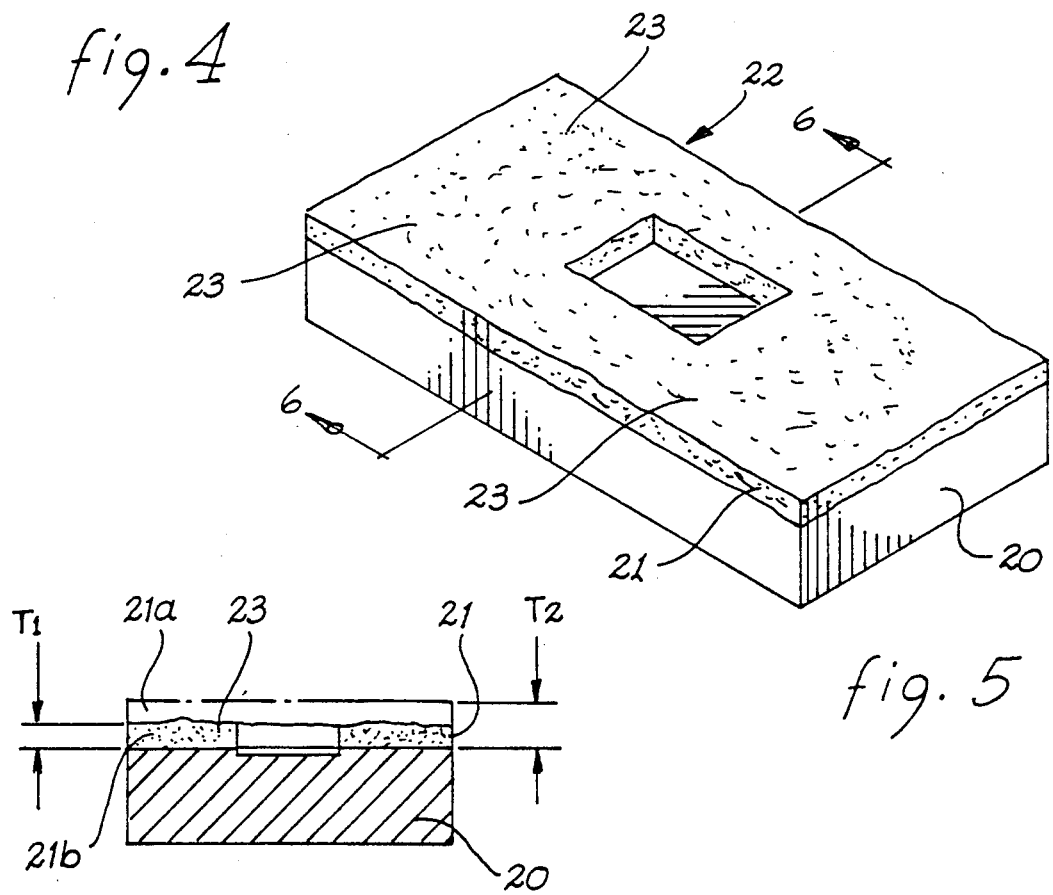
FIG. 5 is a perspective view of a ceramic base having more coherent and uniform layer of glazed sealing glass on its surface than that illustrated in FIG. 3 and that is produced using the thick and thin printing steps according to the FLOW 3E process.
Figure 6:
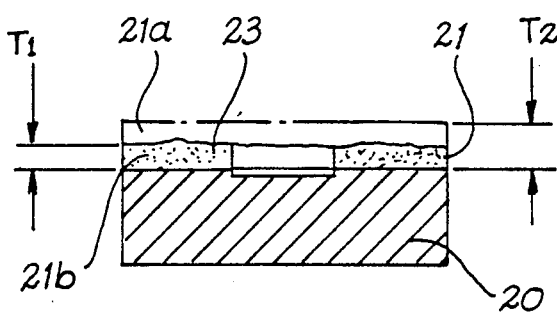
FIG. 6 is a cross-sectional view of a ceramic base taken along the line 6—6 of FIG. 5 illustrating the more uniform sealing glass layers made possible by the sealing glass paste composition of the present invention.
Figure 6A:
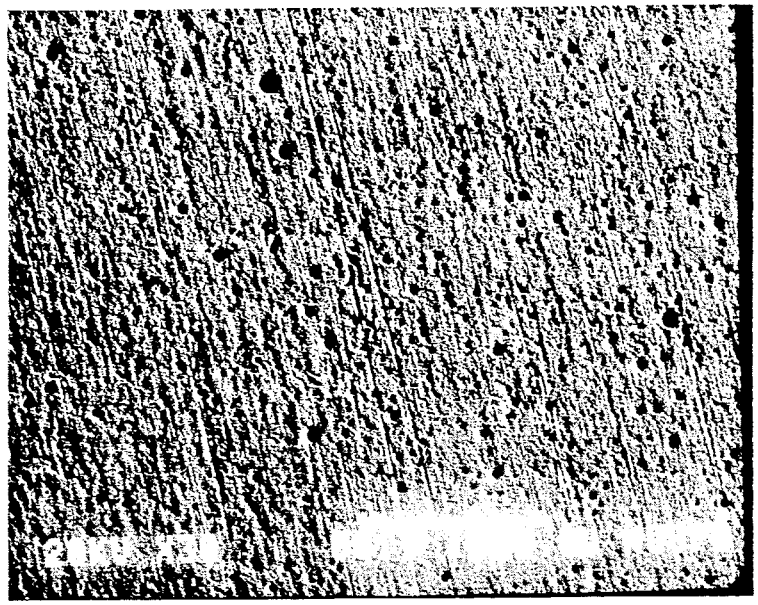
FIG. 6A is a magnified view (30x) of the cross section of the overall glazed layer produced by FLOW 3E, after organic removal by heating.

FIG. 5 illustrates a ceramic base 20 produced by the FLOW 3E process using the E-vehicle based sealing glass paste composition, designated FLOW 3E SG. The ceramic base 20 is shown having a more coherent, uniform and flatter surface texture 23 in the formation of glazed layer 21 on base 20's surface 22. The repeatability of thickness of the layers enables the ceramic base and cap manufacturer to confidently offer ceramic product in various thickness and that will produce a more uniform flow of the glass during a cap-to-base sealing operation. FIG. 6 shows in cross section layer 21 having a layer 21b with a uniform thickness T1 or with another uniform layer 21a having an overall thickness of T2. FIG. 6A is a magnified view (30x) of the cross section of the overall glazed layer produced by FLOW 3E, after organic removal by heating.

Therefore, while the present invention has been shown and described herein in what is believed to be the most practical and preferred embodiments, it is recognized that departures can be made therefore within the scope of the invention, which is therefore not to be limited to the details disclosed therein but is to be accorded the full scope of the claims so as to embrace any and all equivalent apparatus.

We claim:

1. A method of producing a sintered layer of a sealing glass on a ceramic structure used for packaging semiconductor integrated circuits or the like, said method comprising the steps of:
   (a) providing said ceramic structure for being processed through a sealing glass paste composition printing and sintering deposition process;
   (b) preparing at least two sealing glass paste compositions wherein a first of said at least two sealing glass paste compositions consists of a glass powder and a liquid vehicle containing a mixture of 93 wt % isotridecyl alcohol, 5 wt % diacetone acetate and 2 wt % acrylic resin and is characterized by having a glass-to-vehicle ratio range of 9:1 to 15:1, and wherein a second of said at least two sealing glass paste compositions consists of a glass powder and a liquid vehicle containing a mixture 93 wt % isotridecyl alcohol, 0 to =wt % acrylic resin with diacetone acetate being the remainder and is characterized by having a glass-to-vehicle ratio range of 8:1 to 12:1;
   (c) printing said first of said compositions onto a surface of said ceramic structure;
   (d) pressing while printing said second of said compositions onto said printed first composition;
   (e) sintering said printed first and second compositions to produce a first layer of sintered sealing glass; and
   (f) repeating steps (c), (d), and (e) according to a predetermined sealing glass thickness requirement.

2. A method of producing a sintered layer of a sealing glass on a ceramic structure as recited in claim 1 wherein said first and second of said sealing glass paste compositions are prepared having a viscosity ranging from 94 to 104 kilo-centipoise.

* * * * *

UNITED STATES PATENT AND TRADEMARK OFFICE
CERTIFICATE OF CORRECTION

PATENT NO. : 5,013,347
DATED : May 7, 1991
INVENTOR(S) : Seng et al.

It is certified that error appears in the above-identified patent and that said Letters Patent is hereby corrected as shown below:

In Column 8, Claim 1, Line 39, replace the symbol "≡" with the numeral --5--.

Signed and Sealed this

Thirty-first Day of August, 1993

*Attest:*

BRUCE LEHMAN

*Attesting Officer*   *Commissioner of Patents and Trademarks*